(12) United States Patent
Satoh

(10) Patent No.: US 7,173,499 B2
(45) Date of Patent: Feb. 6, 2007

(54) HIGH-STABILITY PIEZOELECTRIC OSCILLATOR

(75) Inventor: Tomio Satoh, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 341 days.

(21) Appl. No.: 10/828,054

(22) Filed: Apr. 20, 2004

(65) Prior Publication Data
US 2006/0132251 A1 Jun. 22, 2006

(30) Foreign Application Priority Data
Apr. 21, 2003 (JP) ............................ 2003-115600

(51) Int. Cl.
*H03B 5/32* (2006.01)
(52) U.S. Cl. ........................ 331/158; 331/176; 331/66; 331/68; 331/69; 331/116 R
(58) Field of Classification Search ................. 331/66, 331/176, 158, 68, 69, 116 R
See application file for complete search history.

(56) References Cited

U.S. PATENT DOCUMENTS 6,621,361 B1 * 9/2003 Fry .............................. 331/69
6,859,110 B2 * 2/2005 Satoh .......................... 331/69

* cited by examiner

*Primary Examiner*—Arnold Kinkead
(74) *Attorney, Agent, or Firm*—Koda & Androlia

(57) ABSTRACT

Design means is provided to prevent electronic parts used in a high-stability piezoelectric oscillator from deterioration due to aging by heat when the high-temperature side of the working temperature range is as high as 85° C. A high-stability piezoelectric oscillator, which is provided with a first constant temperature oven having housed therein a piezoelectric resonator and electronic parts for oscillation, a second constant temperature oven having housed herein said first constant temperature oven, and temperature control means for controlling the temperature of each constant temperature oven, and in which the temperature of said first constant temperature oven is set lower than the temperature of said second constant temperature oven, is characterized in that a heat source is disposed near said piezoelectric resonator.

1 Claim, 4 Drawing Sheets

HIGH-STABILITY PIEZOELECTRIC OSCILLATOR

BACKGROUND OF THE INVENTION

1. Field of the Invention

The present invention relates to a high-stability piezoelectric oscillator and, more particularly, to a high-stability piezoelectric oscillator that uses a Peltier element as a temperature control element for an inner constant temperature oven of a double constant temperature oven to set the temperature of the inner oven lower than the temperature of the outer oven.

2. Background Art

Because of its excellent frequency accuracy, frequency-temperature characteristics, frequency-aging characteristics, a high-stability crystal oscillator (OCXO) is in wide use ranging from a mobile radio base station to a high-precision measuring instrument. The high-stability crystal oscillator has a construction in which a quartz crystal resonator and an oscillation circuit are placed in a constant temperature oven to prevent the oscillation frequency from varying with ambient temperature. A high-stability crystal oscillator for higher precision application uses a doubly-rotated quartz crystal resonator, such as SC-cut or IT-cut quartz crystal resonator, and it is known in the art that the use of such a quartz crystal resonator provides a crystal oscillator whose stress-sensitivity and thermal shock resistance characteristics are more excellent than in the case of using an AT-cut quartz crystal resonator.

FIG. 3 is a graph showing reactance characteristics of near resonance point of the SC-cut quartz crystal resonator, the abscissa representing frequency and the ordinate representing reactance; the quartz crystal resonator is excited in three modes, that is, a thickness shear mode (C-mode) for the principal vibration at the lowest frequency among the three modes, a thickness twist mode (B-mode) and a thickness longitudinal mode (A-mode) at higher frequency than the thickness shear mode. Since the resonance frequency (f2) of the B-mode adjacent to the C-mode (the resonance frequency f1) of the principal vibration is about 9 to 10% higher than the C-mode resonance frequency f1, the oscillation circuit is so adapted as to prevent the occurrence of a so-called frequency jump phenomenon.

FIG. 4 is a graph showing the frequency-temperature characteristic of the SC-cut quartz crystal resonator (C-mode), which assumes a cubic curve with the inflection point temperature (Ti) at approximately 95° C., the abscissa representing temperature (° C.) and the ordinate a normalized frequency variation ($\Delta f/f$). The peak temperature Tp, which has a zero temperature coefficient at a temperature lower than the inflection point temperature (Ti), is dependent on the second angle of rotation at which quartz crystal is cut, and the peak temperature Tp is set substantially in the range of 65° C. to 81° C. Accordingly, by setting the temperature in the constant temperature oven at a value close to the peak temperature Tp, it is possible to obtain a stable frequency.

For example, when the high-stability crystal oscillator is used over a temperature range from 0° C. to 50° C., provision is made to hold the temperature in the constant temperature oven, for example, at 70° C., 10° C. to 20° C. higher than the upper limit temperature 50° C. And, the use of the SC-cut quartz crystal resonator whose peak temperature Tp is approximately 70° C. ensures a stable oscillation frequency of the oscillator without being affected by ambient temperature.

FIG. 5 is a sectional view showing the construction of the high-stability crystal oscillator, wherein a printed board 21 having mounted thereon an SC-cut quartz crystal resonator 22, electronic parts 23 for oscillation use and a thermo-sensitive device 24 is housed in a constant temperature oven 25, and a heater 26 is wound around the constant temperature oven 25. A power supply terminal, an output terminal, and other terminals 27, 27 . . . extended from the printed board 21 pass in insulation through the constant temperature oven 25 and a base 28 by use of hermetic terminals or the like. The base 28 is covered with a case 29, their joints being sealed by soldering or the like. Voltage application to the terminal 27 causes a current flow through the heater 26, and the thermo-sensitive device and a control circuit operate to keep the temperature of the constant temperature oven 25 at a fixed value.

In recent years, there is a demand for a high-stability crystal oscillator that operates stably even under high ambient temperature conditions. For example, when the working temperature range is 0° C. to 85° C., the temperature of the constant temperature oven needs to be set at about 95° C. higher than the upper limit 85° C. of the ambient temperature.

However, electronic parts comprising the oscillation circuit are mostly rated up to approximately 85° C., and their use at higher temperatures is not guaranteed. There are also electronic parts for military and satellite use that can be used at higher temperatures, but they are extremely expensive. Furthermore, high-temperature operations also accelerate aging of the quartz crystal resonator, arousing the fear of a frequency shift or the like. Besides, the peak temperature Tp of the SC-cut quartz crystal resonator is 81° C. at the highest and cannot be set higher.

In view of the above, there is proposed a high-stability crystal oscillator using a Peltier element (an element utilizing a Peltier effect, a phenomenon that the application of current to the junction of different kinds of conductors (or semiconductors) causes generation or absorption of heat. The amount of heat generated or absorbed is in proportion to the current applied, and reversal of the direction of current reverses the generation and absorption of heat.) as disclosed in Japanese Laid-open application publication No. 3-104404. For example, when the working temperature range is 0° C. to 85° C., if the inside temperature of the constant temperature oven is set at 70° C., the Peltier element and the temperature control circuit operate to heat or cool the constant temperature oven to maintain it at 70° C. In this instance, an SC-cut quartz crystal resonator with Tp=70° C. can be used as the quartz crystal resonator.

FIG. 6 is a sectional view showing the construction of the high-stability crystal oscillator using the Peltier element, wherein a printed board 31 having mounted thereon an SC-cut quartz crystal resonator 32, electronic parts 33 for oscillation use, and a thermo-sensitive device 34 is housed in a constant temperature oven 35, and a Peltier element 36 is mounted on the constant temperature oven 35. A power supply terminal, an output terminal, and other terminals 37, 37 . . . extended from the printed board 31 pass in insulation through the constant temperature oven 35 and a base 38 by use of hermetic terminals or the like. The base 38 is covered with a case 39, their joints being sealed by soldering or the like. By applying current to the Peltier element 36 via the power supply terminal 37, the constant temperature oven 35 can be held at a predetermined temperature, for example, at 70° C.

In the high-stability crystal oscillator using the Peltier element as shown in FIG. 6, however, it is very difficult to keep the inside temperature of the oven at 70° C. when an ambient temperature is about 70° C. That is, the inside temperature of the oven is controlled by the current supply to the Peltier element 36, however, no current is applied to the Peltier element when the ambient temperature is about 70° C. or so. Therefore, it is difficult to control the inside temperature under the condition that the current supply is almost zero or very small. As is well known in the art, the temperature of the constant temperature oven becomes stable and easy to control by setting it at least 10° C. to 20° C. higher than the ambient temperature.

The present invention is intended to solve the above-mentioned problems, and has for its object to provide a high-stability crystal oscillator that operates stably even when the required temperature range is as wide as 0° C. to 85° C. and minimizes deterioration of the quartz crystal resonator and electronic parts used due to aging.

SUMMARY OF THE INVENTION

To solve the above-mentioned problems, the invention recited in claim 1 of this application is directed to a high-stability piezoelectric oscillator which is provided with a first constant temperature oven having housed therein a piezoelectric resonator and electronic parts for oscillation use, a second constant temperature oven having housed therein said first constant temperature oven and temperature control means for controlling the temperature of each constant temperature oven, wherein the temperature of said first constant temperature oven is set lower than the temperature of said second constant temperature oven, characterized in that a heat source is disposed near said piezoelectric resonator.

The invention recited in claim 2 is directed to the high-stability piezoelectric oscillator of claim 1 which is characterized in that: the temperature of said first and second constant temperature ovens are controlled by use of a Peltier element; said piezoelectric resonator is an SC-cut quartz crystal resonator; and the temperature of said first constant temperature oven is set at a value close to the peak temperature of said SC-cut quartz crystal resonator.

DETAILED DESCRIPTION OF THE PREFERRED EMBODIMENTS

Figure 1:
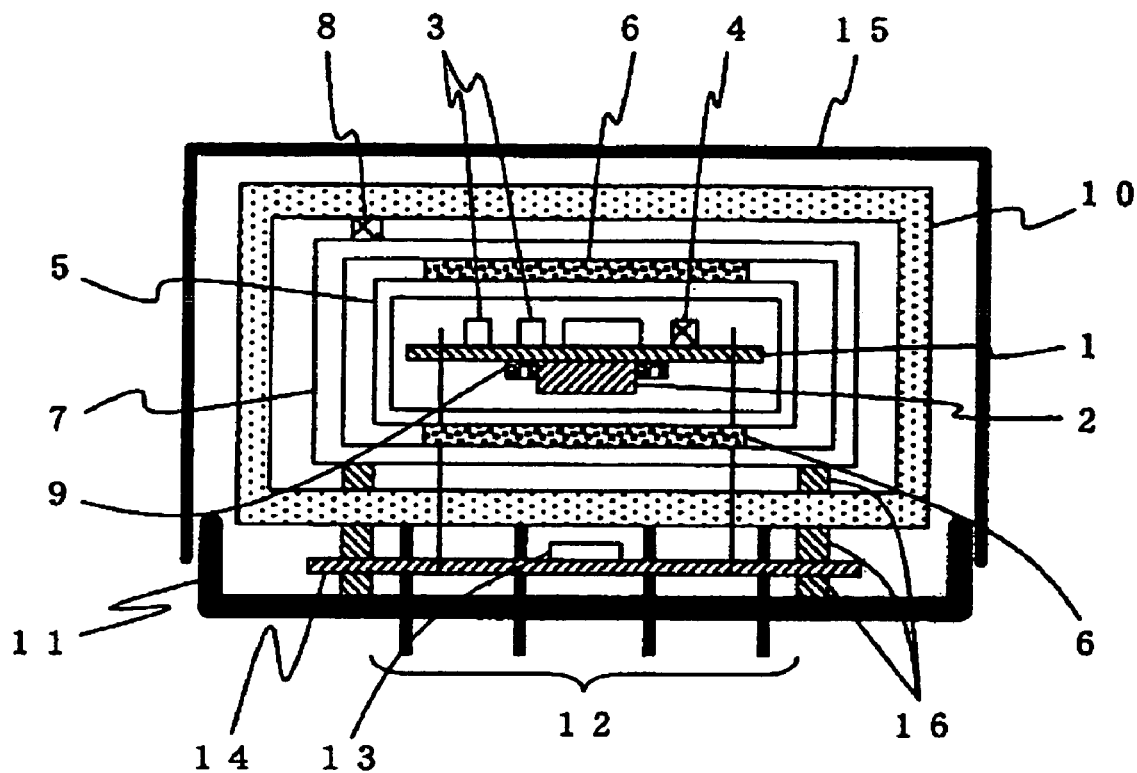
FIG. 1 is a sectional view illustrating the construction of the high-stability piezoelectric oscillator according to the present invention.

The present invention will be described in detail with reference to its embodiments shown in the drawings.

FIG. 1 illustrates in section the construction of the high-stability crystal oscillator according to the present invention; a first printed board 1 is housed in a first constant temperature oven 5, the first printed board having mounted on one of its principal surface, for example, on the underside thereof, an SC-cut quartz crystal resonator 2 and a heater 9 surrounding the SC-cut quartz crystal resonator 2 and having on the other principal surface, for example, on the top thereof, electronic parts 3 forming a temperature control circuit and an oscillation circuit, and a first thermo-sensitive device 4, and a Peltier element 6 is wound around and bonded to the constant temperature oven 5. The first constant temperature oven 5 is housed in a larger second constant temperature oven 7, a second thermo-sensitive device 8 is bonded to the second constant temperature oven 7, after which the second constant temperature oven 7 is entirely covered with an heat insulator 10.

Then a second printed board 14 having mounted thereon an amplifier circuit and a temperature control circuit 13 is fixed to a base 11 by hermetic shield terminals 12, 12, and lead terminals 12a, 12a are passed in insulation through the heat insulator 10, the second constant temperature oven 7 and the first constant temperature oven 5 and connected to printed circuits formed on the first printed board 1. The base 11 is covered with a metal case 15, and their joints are sealed by soldering or the like.

To withstand vibrations and shocks, the first constant temperature oven 5, the second constant temperature oven 7, the heat insulator 10, the second printed board 14 and the base 11 are fixed together as by adhesive with insulating members 16, 16 . . . sandwiched between them.

A feature of the present invention is to control the current supply to the Peltier element to transfer the heat of the inner first constant temperature oven to the outer constant temperature oven in the double constant temperature oven using the first and second constant temperature ovens 5 and 7. That is, the current supply to the Peltier element is controlled to heat the second constant temperature oven but cool the first constant temperature oven and hold the latter at a temperature lower than that of the former.

Figure 2:
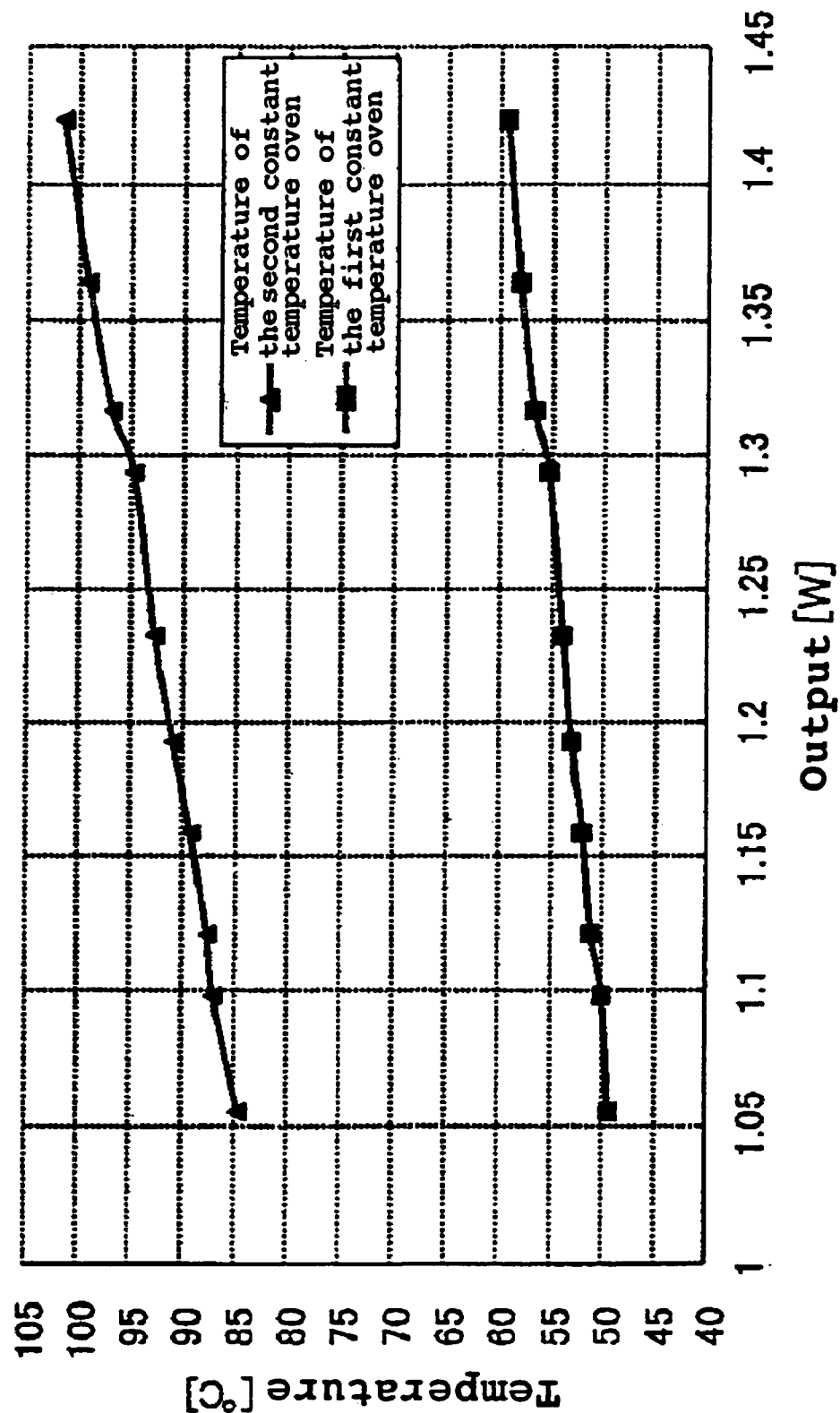
FIG. 2 is a graph showing the Peltier effect of the Peltier element.
Figure 3:
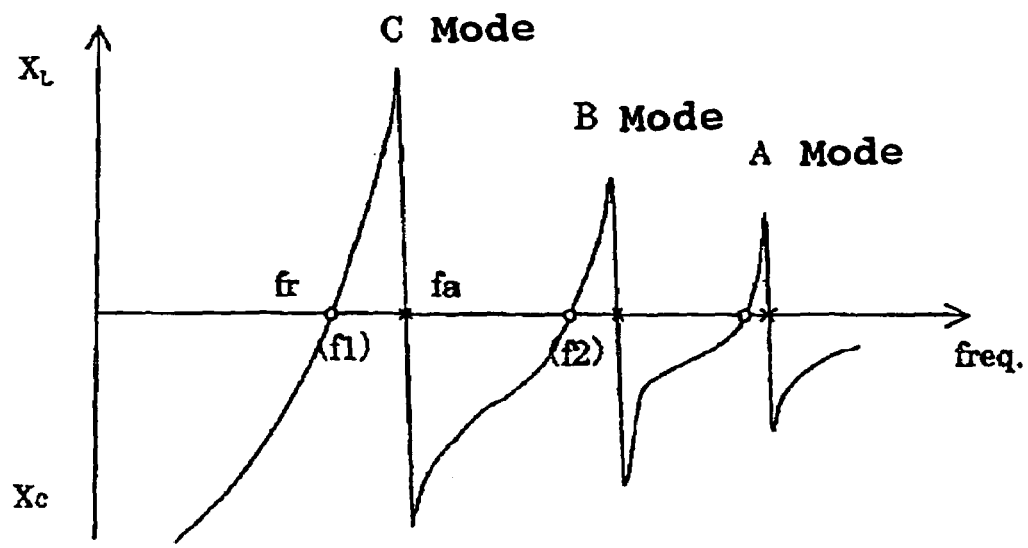
FIG. 3 is a graph showing frequency responses of the SC-cut quartz crystal resonator in C-mode, B-mode and A-mode.
Figure 4:
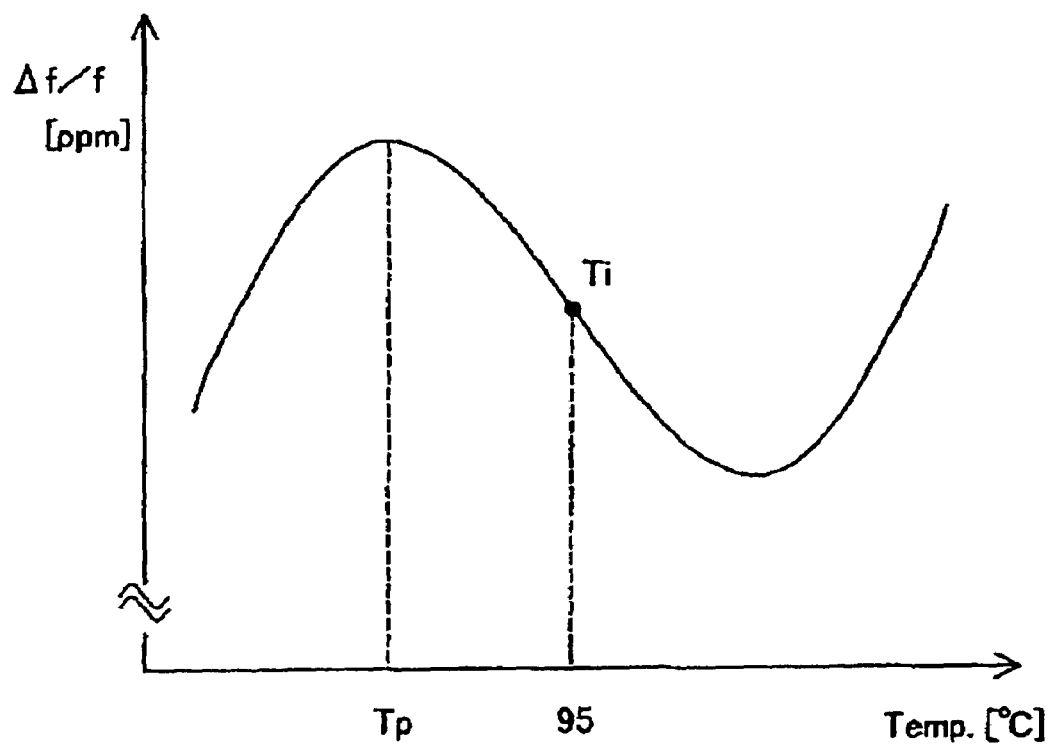
FIG. 4 is a graph showing the frequency-temperature characteristic of the SC-cut quartz crystal resonator in C-mode.
Figure 5:
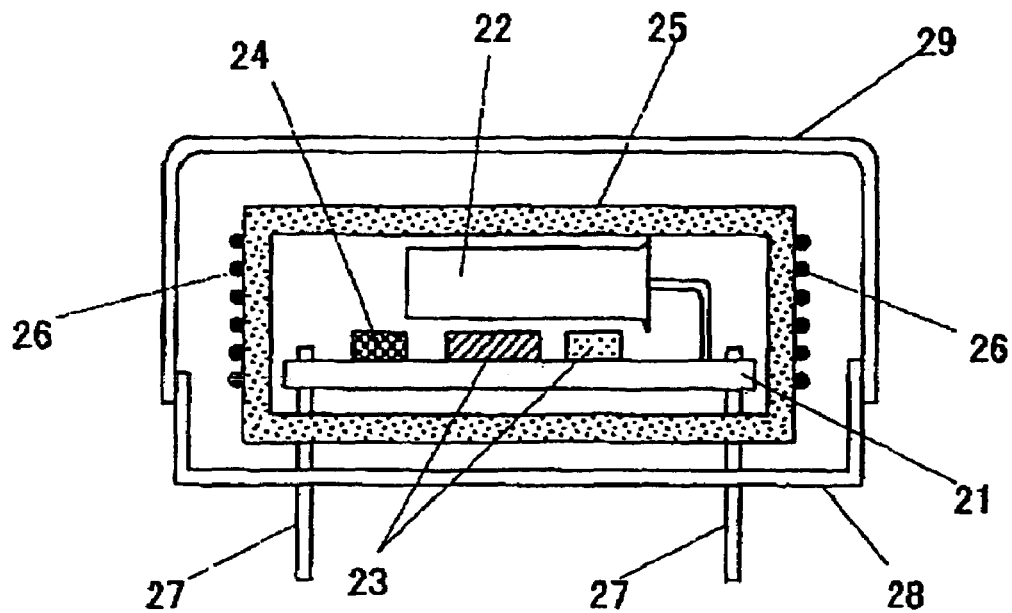
FIG. 5 is a sectional view showing the construction of a conventional high-stability crystal oscillator.
Figure 6:
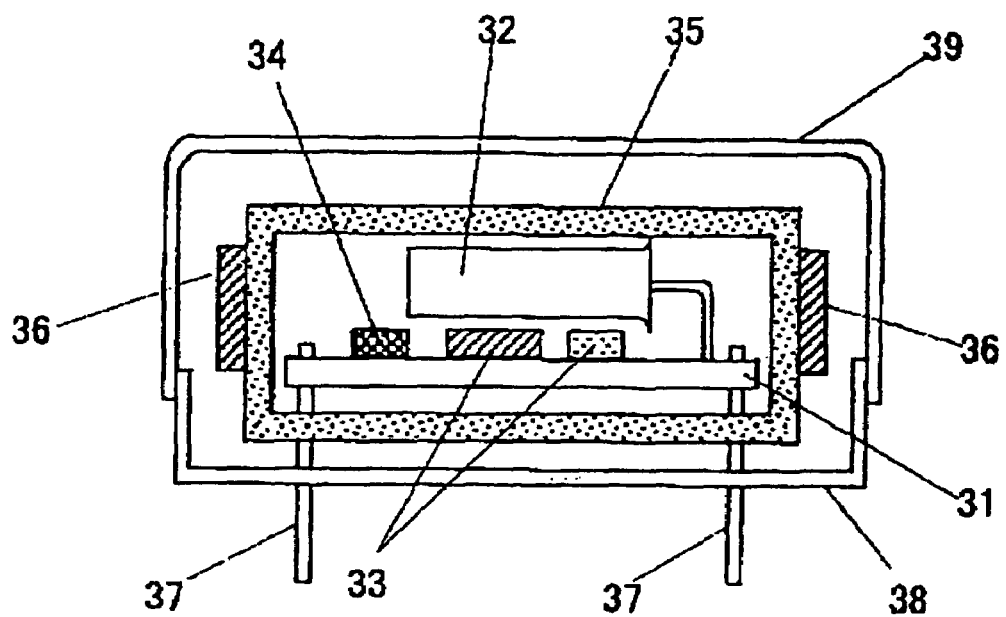
FIG. 6 is a sectional view showing the construction of a high-stability piezoelectric oscillator using the Peltier element as a temperature control element for the constant temperature oven.

FIG. 2 is a graph showing the Peltier effect of the Peltier element; from FIG. 2 the difference between the temperature of the first constant temperature oven and the temperature of the second constant temperature oven can be estimated at approximately 35° C., although it varies with the performance and construction of the Peltier element used.

Accordingly, in the high-stability piezoelectric oscillator of this embodiment, if the temperature of the second constant temperature oven is set at, for example, 95° C., the portion of the first constant temperature oven held in close contact with the Peltier element is about 60° C. The temperature of the oscillator housed in the first constant temperature oven, in particular, the SC-cut quartz crystal resonator, is controlled by the heater 9 and the temperature control circuit to be a fixed temperature higher than the temperature of the first constant temperature oven, for example, 75° C.

With such a double-structured constant temperature oven wherein the inner constant temperature oven is set at a temperature lower than that of the outer constant oven, even when the required temperature range is as wide as 0° C. to 85° C., the SC-cut quartz crystal resonator can be used, and excellent stress-sensitivity and thermal shock resistance characteristics can be obtained. Since the second constant temperature oven is set at a temperature sufficiently higher than the 85° C. upper limit of the temperature range, it is possible to effect temperature control irrespective of the ambient temperature, and since the first constant temperature oven is set at a temperature (60° C.) sufficiently lower than the peak temperature 75° C. of the SC-cut quartz crystal resonator, it is possible to effect stable temperature control for holding the SC-cut quartz crystal resonator at 75° C. by the heater 9.

Besides, since the temperature of the first constant temperature oven is lower than 85° C., it is possible to prevent aging of the SC-cut quartz crystal resonator and deterioration of the electronic parts used.

While in the above the present invention has been described as using the SC-cut quartz crystal resonator, it is needless to say that the present invention is applicable to the AT-cut quartz crystal resonator as well.

Although in the above the present invention has been described as using the quartz crystal resonator, it is needless to say that the present invention is not limited specifically to the quartz crystal resonator but is applicable as well to resonators using such piezoelectric materials as langasite, lithium tetraborate, lithium tantalite and lithium niobate.

With such an arrangement as described above, it is possible to obtain a high-stability crystal oscillator that operates stably even when the required temperature range is as wide as 0° C. to 85° C. and minimizes deterioration of the quartz crystal resonator and electronic parts used due to aging.

According to the invention recited in claim 1, since the temperature of the inner constant temperature oven can be set at a value lower than the ambient temperature range, it is possible to suppress deterioration of the piezoelectric oscillator and electronic parts due to aging by heat.

According to the invention recited in claim 2, the SC-cut quartz crystal resonator is used, and the temperature of the inner constant temperature oven can be set within a designed range of the peak temperature Tp of the SC-cut quartz crystal resonator—this also produces the effect of preventing deterioration of the quartz crystal resonator and the electronic parts.

What is claimed is:

1. A high-stability piezoelectric oscillator which is provided with:
    a first constant temperature oven having housed therein a piezoelectric resonator and electronic parts for oscillation use;
    a second constant temperature oven having housed therein said first constant temperature oven; and
    temperature control means for controlling the temperature of each of said first and second constant temperature ovens;
    wherein the temperature of said first constant temperature oven is set lower than the temperature of said second constant temperature oven;
    characterized in that;
    a heat source is disposed near said piezoelectric resonator;
    the temperatures of said first and second constant temperature ovens are controlled by use of a Peltier element;
    said piezoelectric resonator is an SC-cut quartz crystal resonator; and
    the temperature of said first constant temperature oven is set at a value close to the peak temperature of said SC-cut quartz crystal resonator.

* * * * *